United States Patent
Myles

(10) Patent No.: US 8,604,871 B2
(45) Date of Patent: Dec. 10, 2013

(54) HIGH GAIN AMPLIFIER METHOD USING LOW-VALUED RESISTANCES

(75) Inventor: Andrew Myles, Edinburgh (GB)

(73) Assignee: Dialog Semiconductor GmbH., Kirchheim/Teck-Nabern (DE)

( * ) Notice: Subject to any disclaimer, the term of this patent is extended or adjusted under 35 U.S.C. 154(b) by 115 days.

(21) Appl. No.: 13/199,592

(22) Filed: Sep. 2, 2011

(65) Prior Publication Data

US 2013/0049857 A1    Feb. 28, 2013

(30) Foreign Application Priority Data

Aug. 26, 2011   (EP) .................................... 11368023

(51) Int. Cl.
   *H03F 3/45*   (2006.01)
(52) U.S. Cl.
   USPC ............................................. 330/69; 330/260
(58) Field of Classification Search
   USPC .................................................. 330/69, 260
   See application file for complete search history.

(56) References Cited

U.S. PATENT DOCUMENTS

| | | | |
|---|---|---|---|
| 4,074,204 A | 2/1978 | Broburg et al. | |
| 5,661,423 A | 8/1997 | Mizuhara | |
| 7,720,444 B2 | 5/2010 | Darabi et al. | |
| 7,787,642 B2 | 8/2010 | Baker et al. | |
| 2005/0253647 A1 | 11/2005 | Hagari | |
| 2007/0257733 A1 | 11/2007 | Laletin | |
| 2011/0050359 A1 | 3/2011 | Yahav et al. | |

FOREIGN PATENT DOCUMENTS

EP   11368023.5-2215   2/2012

OTHER PUBLICATIONS

"MOSFET-Only Switched-Capacitor Circuits in Digital CMOS Technology," by Hirokazu Yoshizawa et al., IEEE Journal of Solid-State Circuits, vol. 34, No. 6, Jun. 1999, pp. 734-747.
"An Improved Balanced, Floating Output Driver IC," by Gary K. Hebert, AES 108th Convention, Paris, France—An Audio Engineering Society Preprint, Feb. 19-22, 2000, XP040371481, pp. 1-16.
"The Art of Electronics," Paul Horowitz and Winfield Hill, second edition, Cambridge University Press, ISBN 0-521-37095-7, copyright 1989, pp. 222-223, 278-281.
"Fully-Differential Amplifiers," Texas Instruments, Application Report SLOA054D—Jan. 2002 by James Karki, AAP Precision Analog, pp. 1-28.

*Primary Examiner* — Patricia Nguyen
(74) *Attorney, Agent, or Firm* — Saile Ackerman LLC; Stephen B. Ackerman

(57) ABSTRACT

This invention discloses circuit and methods of a NAND-based 2T-string NOR flash cell structure as a building block for a fast random-read NOR flash memory. The key concept of this new set of bias conditions in cell array improves over the critical concern of punch-through issue when cell is migrating to the more advanced technology node of next generation. The invention adopts a novel preferable symmetrical 2T-string NOR flash cell. Each NAND or NAND like cell of this 2T-string NOR cell is to store 2 bits and is preferable to be made of N-channel device. The cell is preferable to use Fowler-Nordheim Tunneling scheme for both erase and program operations- The invention is to provide a novel 2T-string NOR flash cell structure made of N-channel device offering most flexible erase sizes in unit of byte, page, sector, block and chip with the least program and erase disturbances.

19 Claims, 3 Drawing Sheets

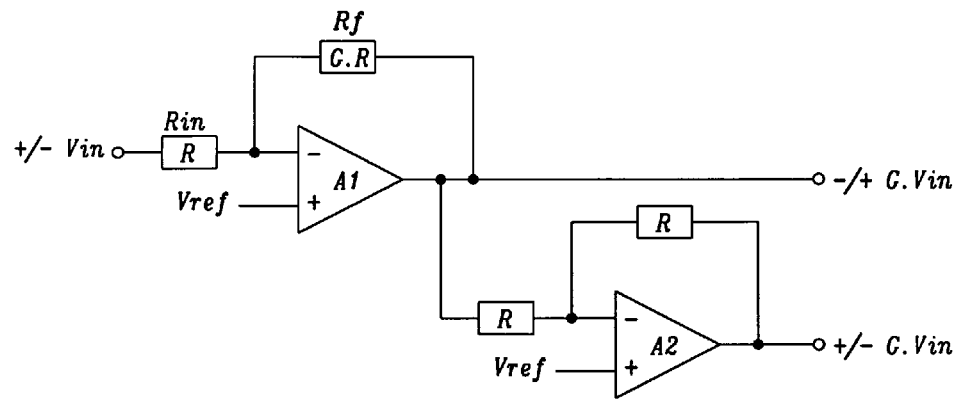
FIG. 1 – Prior Art
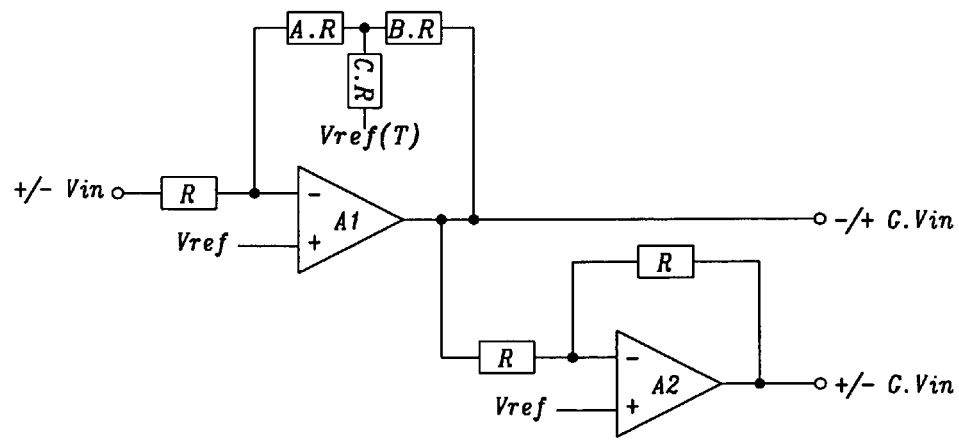
FIG. 2 – Prior Art

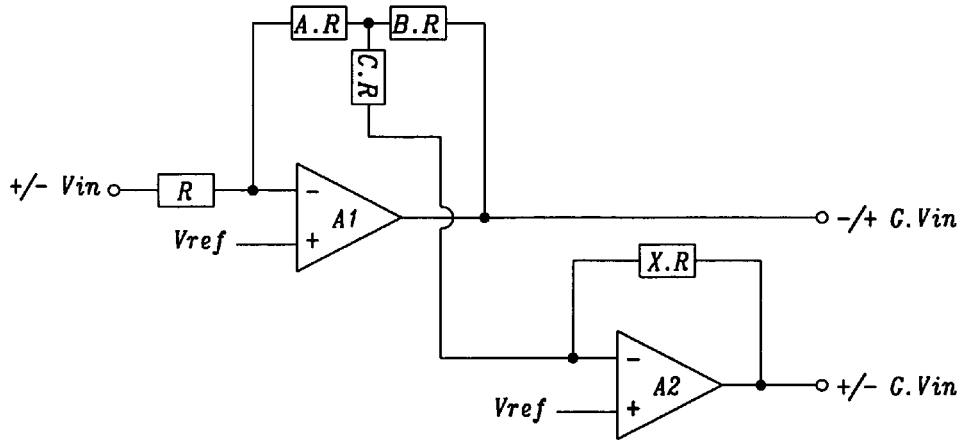

FIG. 5

| Providing a signal processing system comprising two or more amplifier stages using low-valued resistors only | — 60 |

| Reusing one amplifier of the signal processing system to provide a reference voltage or signal for a feedback network around another amplifier of the signal processing system | — 61 |

FIG. 6

| Providing a signal processing system comprising two or more amplifier stages using low-valued resistors only | — 70 |

| Employing one amplifier of the signal processing system both to provide one stage of the signal processing chain and also to provide a reference signal or voltage for a feedback network around another amplifier of the signal processing system | — 71 |

FIG. 7

HIGH GAIN AMPLIFIER METHOD USING LOW-VALUED RESISTANCES

BACKGROUND OF THE INVENTION (1) Field of the Invention

This invention relates generally to amplifiers and relates more specifically to feedback amplifiers having high-gain without requiring large-valued feedback resistors.

(2) Description of the Prior Art

A well-known method for achieving high gain in feedback amplifiers without requiring large-valued feedback resistors (large resistors increase circuit area and cost in silicon implementations) is to use networks such as T- or PI-networks in the feedback path. In differential circuits the T- and PI-networks do not require an additional voltage reference to connect the T- or PI-branches to as the other side of the differential circuit can be used. However, in single-ended circuits a voltage reference is required to connect the T- or PI-branches to. When a suitable low-noise voltage is not already available then generating one may require considerable additional power and, in silicon implementations, area and cost.

A common problem in analog signal processing is converting a single-ended signal to a differential signal to achieve the advantages for working with differential circuits, such as increased dynamic range and improved rejection of common-mode interferer signals such as supply noise. Various methods exist to achieve conversion to a balanced differential signal, such as driving a truly differential amplifier with an unbalanced differential signal comprised of the original single-ended signal and a low-noise voltage reference (which may require an off-chip capacitor or low noise on-chip buffer) or using an additional inverting single-ended stage to provide the non-inverted and inverted signal pairs required in a balanced differential system.

FIG. 1 prior art illustrates a simple signal processing circuit giving single-ended to differential conversion with gain 2G. It shows a common implementation of an operational-amplifier-based gain stage (A1) with input resistor of value R Ohms and feedback resistor G times larger (G.R Ohms) providing gain (−G) in conjunction with a conventional gain (−1) stage (A2) used here to achieve single conversion of a single-ended input signal of amplitude +/− Vin to a balanced differential output of amplitude +/− (2.G.Vin), i.e. the gain to each output amounts to G, so single ended to differential conversion gain amounts to 2G.

Amplifier stages (A1) and (A2) are very well-known operational-amplifier-based inverting gain stages; each having signal gain G=(−Rf/Rin) where Rf is the feedback resistor (here having value G.R Ohms for amplifier stage (A1) and R for stage (A2)) and Rin is the input resistor (here having value R Ohms for both stages (A1) and (A2). The design techniques for such amplifier stages are familiar to many engineers.

If high gain is required because the input signal is very small, such as when e.g. the circuit of FIG. 1 prior art is used as a single-ended microphone input in an audio CODEC, then the large value of G required to achieve high gain means that the feedback resistor Rf around stage (A1) must become very large (assuming that other system specifications prohibit gain increase by reducing the stage (A1) input resistance Rin to less than R to increase the ratio Rf/Rin). In silicon implementations of this circuit, the feedback resistor Rf will then require a large silicon area, which increases the final circuit area and hence die cost.

It is a challenge for the designers of amplifiers designing circuits allowing high-gain single-ended to differential conversion circuits using low-valued resistors without requiring a low-noise reference voltage to connect a T-network to.

There are known patents dealing with amplifiers using a T-network:

U.S. Patent Publication (US 2011/0050359 to Yahav et al.) discloses a signal conversion apparatus including first and second input ports and first and second output ports. A first splitter is coupled to convert a first single-ended signal received on the first input port into a differential signal including first and second opposite-phase components, and to provide the first and second opposite-phase components respectively on the first and second output ports. A second splitter is separate from the first splitter and is coupled to convert a second single-ended signal received on the second input port into a common-mode signal including first and second in-phase components, and to provide the first and second in-phase components respectively on the first and second output ports together with the first and second opposite-phase components.

U.S. Patent (U.S. Pat. No. 7,720,444 to Darabi et al.) proposes a transceiver with a receiver, a transmitter, a local oscillator (LO) generator, a controller, and a self-testing unit. All of these components can be packaged for integration into a single IC including components such as filters and inductors, and a controller for adaptive programming and calibration of the receiver, transmitter and LO generator. A self-testing unit generates test signals with different amplitudes and frequency ranges. The test signals are coupled to the receiver, transmitter, and LO generator. A receiver front end includes a low noise amplifier (LNA), which provides high gain with good noise figure performance.

U.S. Patent (U.S. Pat. No. 7,787,642 to Baker et al.) discloses a low power high dynamic range microphone amplification system. The system includes a current sensing amplifier for receiving an input current signal representative of auditory information and for providing an amplifier output signal. The current sensing amplifier includes a DC bias network that includes a cascode filter. A T-network network in effect forms a current divider at high frequencies and attenuates current in the feedback path. Thus, it provides gain at high frequencies. At low frequencies, there is no current attenuation, so the DC gain is lower. The T-network in this case uses a capacitor for connecting the T-branch to. This approach is not feasible for integrated circuits processing signals with frequency content from dc to medium frequencies (such as audio signals), as very large capacitances would be needed to provide a low reactance at signal frequencies; implementing even small capacitors can require very considerable silicon area.

Furthermore the following textbook describes generally design of amplifiers:

(1) "The Art of Electronics", Paul Horowitz and Winfield Hill, second edition, Cambridge University Press, ISBN 0-521-37095-7.

SUMMARY OF THE INVENTION

A principal object of the invention is to reuse one amplifier in a signal processing system to provide a reference voltage or signal for a feedback or input network around another amplifier.

Another principal object of the present invention is to achieve high gain in feedback amplifiers without requiring large-valued feedback resistors.

A further object of the invention is to achieve high gain single-ended to differential conversion circuits using low-valued resistors without requiring a low-noise reference voltage to connect a T-network to.

A further object of the invention is to use various configurations of an additional inverting amplifier to provide the T-branch connection point.

A further object of the invention is to re-use of one amplifier in an analog signal processing chain to provide a suitable reference for a feedback network (e.g. T- or PI-network) of another amplifier stage in a signal-processing system.

A further object of the invention is to reduce power and resistor values required in implementing signal processing circuits.

In accordance with the objects of this invention a method to achieve high gain signal processing systems having more than one stage without the need of more than one reference voltage source has been achieved, The method invented comprises the following steps: (1) providing a signal processing system comprising two or more amplifier stages using low-valued resistors only, and (2) reusing one amplifier of the signal processing system to provide a reference voltage or signal for a feedback network around another amplifier of the signal processing system.

In accordance with the objects of this invention a method to achieve high gain signal processing systems having more than one stage without the need of more than one reference voltage source has been achieved, The method invented comprises the following steps: (1) providing a signal processing system comprising two or more amplifier stages using low-valued resistors only, and (2) employing one amplifier of the signal processing system both to provide one stage of the signal processing chain and also to provide a reference signal or voltage for a feedback network around another amplifier of the signal processing system.

In accordance with the objects of this invention a signal processing system is disclosed. The signal processing system invented comprises two or more amplifier stages, wherein an input of an amplifier is providing an implicit buffered reference voltage that is used by one or more other amplifier stages of the signal processing system.

In accordance with the objects of this invention a signal processing system is disclosed. The signal processing system invented comprises two or more amplifier stages, wherein employing one amplifier of the signal processing system both to provide one stage of the signal processing chain and also to provide a reference signal or voltage for a feedback network around another amplifier of the signal processing system.

BRIEF DESCRIPTION OF THE DRAWINGS

In the accompanying drawings forming a material part of this description, there is shown:

FIG. 1 prior art illustrates a simple signal processing circuit giving single-ended to differential conversion with gain 2G.

FIG. 2 prior art shows a method for implementing the circuit of FIG. 1 prior art with less total in-circuit resistance.

FIG. 5 shows an alternative new implementation of FIG. 4 that also does not require an additional voltage reference source Vref (T).

FIG. 6 illustrates a flowchart of a method invented to achieve high gain signal processing systems without the need of more than one reference voltage source.

FIG. 7 illustrates a flowchart of an alternative method invented to achieve high gain signal processing systems without the need of more than one reference voltage source.

DESCRIPTION OF THE PREFERRED EMBODIMENTS

Figure 3:
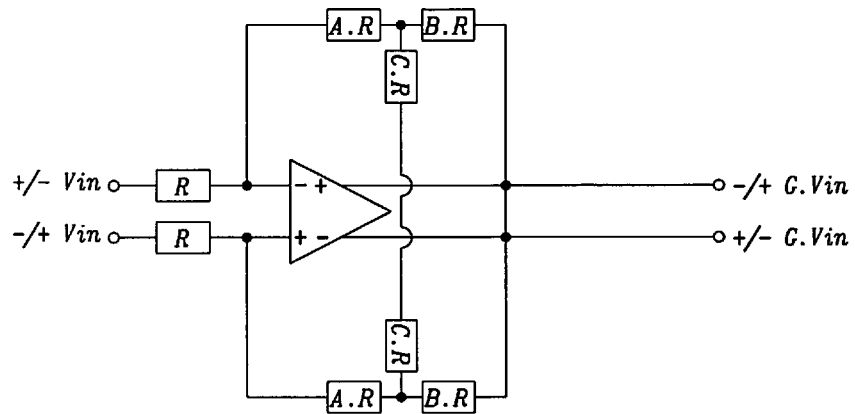
FIG. 3 shows a differential high gain amplifier based on the principles of FIG. 2 prior art.

Circuits and methods to achieve high gain in feedback amplifiers without requiring large-valued feedback resistors are disclosed, wherein high gain single-ended to differential conversion circuits using low-valued resistors are deployed without requiring a low-noise reference voltage to connect a T-network to.

The T-network configurations described here allow high gain single-ended to differential conversion circuits to be designed using low-valued resistors without requiring a low-noise reference voltage to connect the T-network to (which would require considerable additional power and silicon area); this is achieved by using various configurations of the additional inverting amplifier to provide the T-branch connection point. The method could be extended to other possible feedback networks such as PI-networks and other applications beyond single-ended to differential conversion.

FIG. 2 prior art shows a method for implementing the circuit of FIG. 1 prior art with less total in-circuit resistance. It shows a less-commonly seen prior art method (see FIG. 4.49 in reference 1) that can be used to reduce the total resistance (and hence silicon area) required by the feedback network around stage (A1) to achieve a given gain.

In FIG. 2 prior art, a T-network comprising resistors with values A, B and C times respectively larger than the input resistance R is used as the feedback network around amplifier stage (A1). The T-branch of the network (C.R) connects to a voltage Vref (T). Normally Vref (T) will be equal to the voltage Vref connected to the non-inverting inputs of amplifiers (A1) and (A2) to avoid any dc voltage shifts in the resistor network around (A1), but this is not a necessary condition to achieve the correct signal gain. Amplifier stage (A2) remains a gain (−1) stage as shown in FIG. 1 prior art. The gain of stage (A1) can be shown to be $$\text{GAIN}=G=-(A.B+A.C+B.C)/C \qquad (\text{EQN1})$$

and it can be seen that choosing a suitable low value for C permits very high gain to be achieved even for modest (low silicon area) values of A and B, wherein A.B means A multiplied by B.

For example, to achieve a gain G=64 using the circuit of FIG. 1 prior art requires (1+G) R-valued resistors for stage (A1) and 2 resistors for stage (A2), thus requiring a total of 3+G=67 R-valued resistors.

One possible way to implement the same gain using FIG. 2 prior art is to chose A=12, B=4 and C=1. Stage (A1) then requires only 17 (1+A+B+C) resistor units and stage (A2) still requires 2 units, giving a total circuit resistor requirement of (3+A+B+C)=19 resistor units—this is only 28.3% of the resistor area required by the FIG. 1 prior art implementation and can yield a very considerable silicon area and cost saving.

A key point should be noted now. A potentially difficult problem with direct implementation of FIG. 2 prior art however is that the voltage reference Vref (T) used by the T-branch of the feedback network around stage (A1) must be able to source or sink current related to the input signal and hence must be a high-quality, low noise voltage source with low, linear output impedance to avoid one or more of:

gain errors (due to any high output impedance of the voltage reference altering the value of the T-branch impedance significantly from C.R), signal distortion (due to any non-linearity of the voltage reference output impedance), and excess output noise (due to excessive output noise of the voltage reference)

It should be noted that typical integrated implementations of amplifiers (A1) and (A2) will have very high impedance inputs (e.g. MOSFET or JFET), which means that Vref needs not to have especially low or linear output impedance as no current will be sunk or sourced in/out of Vref by the amplifier inputs (Vref must still have low noise however).

Thus a Vref source designed for implementing FIG. 1 prior art may not be suitable for direct connection to Vref (T) in implementation FIG. 2 prior art. If this is the case then a high-performance voltage buffer comprising an amplifier with comparable specifications to (A1) will be required to generate Vref (T) from Vref—this buffer requires additional silicon circuit area that can outweigh any resistor area advantage achieved by using the circuit of FIG. 2 prior art instead of FIG. 1 prior art. Additionally, adding this buffer will considerably increase the total circuit power consumption, which is highly undesirable in, for example, battery-powered applications.

It should be noted that this issue does not arise in fully differential circuit implementations, as each side of a differential circuit can provide a suitable reference for the other, as shown in FIG. 3, which shows a differential high gain amplifier.

The fully differential circuit of FIG. 3 has a differential gain of:

$$G=(A.B+A.C+B.C)/C \quad \text{(EQN 1B)}$$

Figure 4:
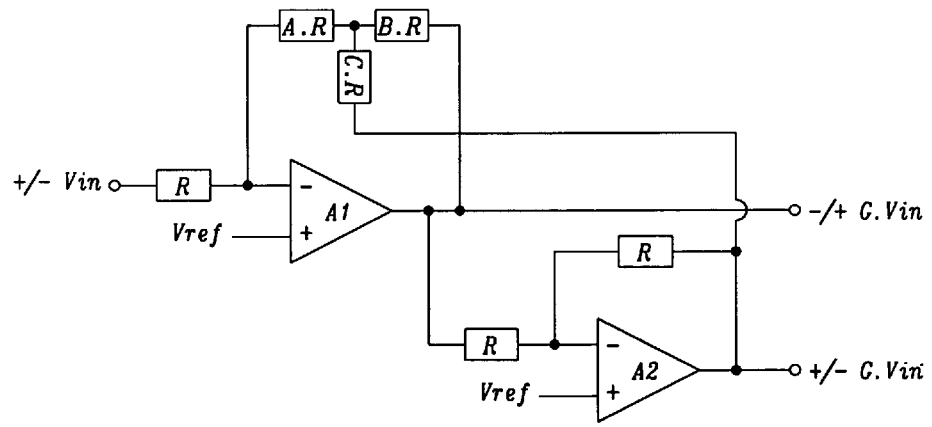
FIG. 4 shows a new implementation of a high gain single-ended (SE) to differential conversion circuit that does not require an additional high-performance reference voltage for the T-network.

FIG. 4 shows a new implementation of a high gain single-ended (SE) to differential conversion circuit that does not require an additional high-performance reference voltage Vref (T) for the T-network as required in FIG. 2 prior art. In FIG. 4 gain (−1) amplifier stage (A2) works double-duty to provide both one side of the differential output voltage and also the connection for the T-branch of the feedback network around amplifier stage (A1), removing the need for an additional voltage reference circuit for the T-branch. The gain from the input to each of the differential outputs of this circuit is $$|Gain|=G=(A.C+A.B+B.C)/(C-B) \quad \text{(EQN 2)}$$

(The single-ended to differential gain is 2 times larger, where the factor 2 arises from the inherent 6 dB gain increase arising from using stage (A2) to convert the singled-ended output of stage (A1) to a balanced differential signal.)

This circuit thus permits the resistor area saving possible by using a T-network for feedback around stage (A1) without the area and power penalties required to generate a reference voltage Vref (T).

Using the circuit of FIG. 4, one possible implementation of a single-ended to differential conversion stage with G=64 (SE to differential gain 128) selects A=12, B=4 and C=6.33333 . . . . This requires only 28 resistor units in total for stages (A1) and (A2), assuming that the ⅓ component of C is implemented using 3 resistor units of value R in parallel (for reasons of resistor matching to achieve precisely defined gain, low part-to-part gain variation and low gain drift in integrated circuit implementations).

Thus implementing a single-ended to differential conversion with G=64 using the circuit of FIG. 4 with the values of A, B and C given above requires only 41.8% of the resistor area an implementation based on FIG. 2 that would require (28 versus 67 identical resistors with value R).

The above is obviously only one example and that an infinite number choices for A, B and C are possible to achieve a given G, each giving different total circuit resistance and hence circuit area. Other system specifications (such as obtaining a particular frequency response by incorporating additional reactive impedances in the T-network) may dictate a specific choice of a given A, B and C. Also obvious is that FIG. 4 illustrates a circuit, which is superior in regard of resistor area required, compared to an implementation of a circuit according to FIG. 2.

FIG. 5 shows an alternative new implementation of FIG. 4 that also does not require the additional voltage reference source Vref (T). In FIG. 5, in addition to (A2) providing one side of the circuit differential output, the inverting input of amplifier (A2) effectively provides a buffered copy of the reference voltage Vref present at the non-inverting input of (A2) via action of the feedback around (A2) and the high open-loop gain of (A2) acting to provide a virtual short between the amplifier inputs. In FIG. 5 this implicit buffering provided by the input of amplifier (A2) is usefully employed to provide the voltage reference required by the T-branch of the feedback network around amplifier (A1).

The magnitude of the gain from the input to each output of this circuit is $$|GAIN|=G=(A.B+A.C+B.C)/C \quad \text{(EQN3)}$$

when X for the feedback around (A2) is set to $$X=G.C/A \quad \text{(EQN4)}$$

Using the circuit of FIG. 5 one possible implementation of a single-ended to differential conversion stage with G=64 (SE to differential gain 128) selects A=12, B=4 and C=1 and X=5.33333 . . . . This requires only 26 identical resistors in total for stages (A1) and (A2), assuming that the ⅓ component of X is implemented using 3 resistor units of value R in parallel.

Thus implementing a single-ended to differential conversion with G=64 using the circuit of FIG. 4 with the values of A, B and C given above requires only 38.8% of the resistor area an implementation based on FIG. 2 would require (26 versus 67 resistor units with value R).

Again, it will be clear the above is only an example and other choices for A, B and C are possible, giving different total circuit resistance and hence area.

It should also be clear that, while the examples circuits given here focus on the specific application of single-ended to differential conversion, the principle involved, namely reusing one amplifier in a signal processing arrangement to provide a reference voltage or signal for a feedback or input network around another amplifier are general and applicable to a wide range of signal processing systems.

It should further be clear that, while the examples circuits given above employ a T-network configuration, the principles can equally apply to other networks such as PI-networks and L-networks, (PI-networks and T-networks can often be interchanged using the Wye-Delta Transform) and to commonly-seen variants of these networks such as bridged-T-networks.

Furthermore it should be noted that the resistors illustrated in FIGS. 4-5 could be replaced with general impedances, e.g. capacitors, inductors, etc, which may implement a frequency-dependent signal gain.

FIG. 6 illustrates a flowchart of a method invented to achieve high gain signal processing systems without the need of more than one reference voltage source. The first step 60 describes providing a signal processing system comprising two or more amplifier stages using low-valued resistors only. The following step 61 depicts reusing one amplifier of the signal processing system to provide a reference voltage or signal for a feedback network around another amplifier of the signal processing system.

FIG. 7 illustrates a flowchart of an alternative method invented to achieve high gain signal processing systems without the need of more than one reference voltage source. The first step 70 describes providing a signal processing system comprising two or more amplifier stages using low-valued resistors only. The following step 71 depicts employing one amplifier of the signal processing system both to provide one stage of the signal processing chain and also to provide a reference signal or voltage for a feedback network around another amplifier of the signal processing system.

While the invention has been particularly shown and described with reference to the preferred embodiments thereof, it will be understood by those skilled in the art that various changes in form and details may be made without departing from the spirit and scope of the invention.

What is claimed is:

1. A method to achieve high gain single-ended to differential conversion circuit comprising more than one stages without the need of more than one reference voltage source, comprising the following steps:
   (1) providing a single-ended to differential conversion circuit comprising two or more amplifier stages using low-valued resistors only; and
   (2) reusing one amplifier of the signal processing system to provide a reference voltage or signal for a feedback T-network or feedback Pi-network around another amplifier stage of the single-ended to differential conversion circuit.

2. The method of claim 1 wherein said feedback networks are enabled to be used to provide high gain with low-valued resistances without needing to generate any additional reference voltage sources in single-ended input amplifier stages.

3. The method of claim 1 wherein it is applied to implementing high-gain single-ended to differential conversion circuit with low resistor circuit area.

4. A method to achieve high gain single-ended to differential conversion circuit comprising more than one stages without the need of more than one reference voltage source, comprising the following steps:
   (1) providing a single-ended to differential conversion circuit comprising two or more amplifier stages using low-valued resistors only; and
   (2) employing one amplifier of the signal processing system both to provide one stage of the signal processing chain and also to provide a reference signal or voltage for a feedback T-network or feedback Pi-network around another amplifier stage of the single-ended to differential conversion circuit.

5. The method of claim 4 wherein said feedback networks are enabled to be used to provide high gain with low-valued resistances without needing to generate any additional reference voltage sources in single-ended input amplifier stages.

6. The method of claim 4 wherein it is applied to implementing high-gain single-ended to differential conversion circuit with low resistor circuit area.

7. A single-ended to differential conversion circuit comprising two or more amplifier stages, wherein an input of an amplifier is providing an implicit buffered reference voltage that is used by one or more other amplifier stages of the single-ended to differential conversion circuit wherein feedback T-networks or feedback Pi-networks are enabled to be used to provide high gain with low-value resistances without needing to generate any additional reference voltage sources in single-ended amplifier stages.

8. The circuit of claim 7 wherein a high-gain single-ended to differential conversion circuit with low resistor circuit area is implemented.

9. The circuit of claim 7, implementing a high gain single-ended to differential conversion circuit, comprising
   a first amplifier having inputs and an output, wherein a first input is a single-ended signal, a second input is a reference voltage, and the output is a first output port of a differential output of the system;
   an input resistance connected between a first input port of the system and the first input of the first amplifier;
   said first input port;
   a T-network feedback loop of the first amplifier connecting the output of the first amplifier with the first input of the amplifier comprising three network resistances, wherein a first network resistance is connected between the output of the first amplifier and a mid-point of the network, the second resistance is connected between said mid-point and the first input of the first amplifier, and the third network resistance is connected between said mid-point and a first input of a second amplifier;
   said three network resistances of the first amplifier;
   said second amplifier, having inputs and an output, wherein a second input is a reference voltage and the output is a second output port of the differential output of the system, and wherein a feedback resistance is connected between the output of the second amplifier and the first input of the second amplifier; and
   said feedback resistance of the second amplifier.

10. The circuit of claim 9 wherein the three network resistances and the feedback resistance of the second amplifier have all resistance values, which are multiples of the resistance value of the input resistance of the first amplifier.

11. The circuit of claim 9, wherein all said resistances are resistors.

12. The circuit of claim 9, wherein all said resistances are replaced with general impedances, which may implement a frequency-dependent signal gain.

13. A single-ended to differential conversion circuit comprising two or more amplifier stages, wherein employing one amplifier of the signal processing system both to provide one stage of the signal processing chain and also to provide a reference signal or voltage for a feedback T-network or a feedback Pi-network around another amplifier of the single-ended to differential conversion circuit enabled to provide high gain with low-value resistances.

14. The circuit of claim 13 wherein said networks are enabled to be used to provide high gain with low-value resistances without needing to generate any additional reference voltage sources in single-ended amplifier stages.

15. The circuit of claim 13 wherein a high-gain single-ended to differential conversion circuit with low resistor circuit area is implemented.

16. The circuit of claim 13, implementing a high gain single-ended to differential conversion circuit, comprising
   a first amplifier having inputs and an output, wherein a first input is a single-ended signal, a second input is a reference voltage, and the output is a first output port of a differential output of the system;
   an input resistance connected between a first input port of the system and the first input of the first amplifier;
   said first input port;
   a T-network feedback loop of the first amplifier connecting the output of the first amplifier with the first input of the amplifier comprising three network resistances, wherein a first network resistance is connected between the output of the first amplifier and a mid-point of the network, the second resistance is connected between said midpoint and the first input of the first amplifier, and the third network resistance is connected between said mid-point and an output of a second amplifier;

said three network resistances of the first amplifier;

said second amplifier, having inputs and an output, wherein a first input is connected via an input resistance of the second amplifier to the output of the first amplifier, a second input is a reference voltage and the output is a second output port of the differential output of the system, and wherein a feedback resistance is connected between the output of the second amplifier and the first input of the second amplifier; and said feedback resistance of the second amplifier.

17. The circuit of claim 16 wherein the three network resistances and the feedback resistance of the second amplifier have all resistance values, which are multiples of the resistance value of the input resistance of the first amplifier.

18. The circuit of claim 16 wherein all said resistances are resistors.

19. The circuit of claim 16, wherein all said resistances are replaced with general impedances, which may implement a frequency-dependent signal gain.

* * * * *

UNITED STATES PATENT AND TRADEMARK OFFICE
CERTIFICATE OF CORRECTION

PATENT NO. : 8,604,871 B2
APPLICATION NO. : 13/199592
DATED : December 10, 2013
INVENTOR(S) : Andrew Myles It is certified that error appears in the above-identified patent and that said Letters Patent is hereby corrected as shown below:

On the title page,
Abstract (57), delete "This invention discloses circuit and methods of a NAND-based 2T-string NOR flash cell structure as a building block for a fast random-read NOR flash memory. The key concept of this new set of the bias conditions in cell array improves over the most critical concern of punch-through issue when cell is migrating to the more advanced technology node of next generation. The invention adopts a novel preferable symmetrical 2T-string NOR flash cell. Each NAND or NAND like cell of this 2T-string NOR cell is to store 2 bits and is preferable to be made of N-channel device. The cell is preferable to use Fowler-Nordheim (F-N) Tunneling scheme for both erase and program operations for the present invention. The invention is to provide a novel 2T-string NOR flash cell structure made of N-channel device offering most flexible erase sizes in unit of byte, page, sector, block and chip with the least program and erase disturbances."

and replace with --One amplifier in a signal processing arrangement is reused to provide a reference voltage or signal for a feedback or input network around another amplifier. T-network configurations are employed allowing high gain single-ended to differential conversion circuits using low-valued resistances without requiring a low-noise reference voltage to connect the T-network to. The principles of the invention, namely reusing one amplifier in a signal processing arrangement to provide a reference voltage or signal for a feedback or input network around another amplifier, are applicable to a wide range of signal processing systems. This is achieved by using various configurations of the additional inverting amplifier to provide the T-branch connection point. The method could be extended to other possible feedback networks such as PI-networks and other applications beyond single-ended to differential conversion.--

Signed and Sealed this
Twenty-fifth Day of March, 2014

Michelle K. Lee
*Deputy Director of the United States Patent and Trademark Office*